United States Patent
Mizota et al.

(10) Patent No.: US 11,495,439 B2
(45) Date of Patent: Nov. 8, 2022

(54) PLASMA PROCESSING APPARATUS

(71) Applicant: TOKYO ELECTRON LIMITED, Tokyo (JP)

(72) Inventors: Kohei Mizota, Hillsboro, OR (US); Shin Okamoto, Miyagi (JP); Atsutoshi Inokuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 43 days.

(21) Appl. No.: 17/003,577

(22) Filed: Aug. 26, 2020

(65) Prior Publication Data
US 2021/0066048 A1 Mar. 4, 2021

(30) Foreign Application Priority Data
Aug. 26, 2019 (JP) .............................. JP2019-153599

(51) Int. Cl.
*H01J 37/32* (2006.01)
*H05H 1/46* (2006.01)
*H01J 37/16* (2006.01)

(52) U.S. Cl.
CPC ........ *H01J 37/32449* (2013.01); *H01J 37/16* (2013.01); *H01J 37/32009* (2013.01); *H01J 37/32715* (2013.01); *H05H 1/46* (2013.01); *H01J 2237/20207* (2013.01); *H01J 2237/334* (2013.01)

(58) Field of Classification Search
CPC ...................... H01J 37/32449; H01J 37/32715
See application file for complete search history.

(56) References Cited

FOREIGN PATENT DOCUMENTS

JP 2015-109412 A 6/2015

*Primary Examiner* — Joseph L Williams
(74) *Attorney, Agent, or Firm* — Nath, Goldberg & Meyer; Jerald L. Meyer; Tanya E. Harkins

(57) ABSTRACT

An apparatus for plasma processing that performs an etching on a workpiece, includes: a container; a gas supply system for supplying a processing gas into the container; a plasma source for exciting the processing gas; a support for holding the workpiece inside the container; an exhaust system for exhausting an internal space of the container; electrode plates provided on an inner wall of the container; insulators for electrically insulating the electrode plates from each other; a DC power supply for independently applying a DC voltage to each of the electrode plates; and a controller for controlling the gas supply system, the plasma source, and the DC power supply. The controller controls the gas supply system, the plasma source, and the DC power supply such that the DC voltage is supplied to each electrode plate during execution of the etching or after completion of the etching.

13 Claims, 2 Drawing Sheets

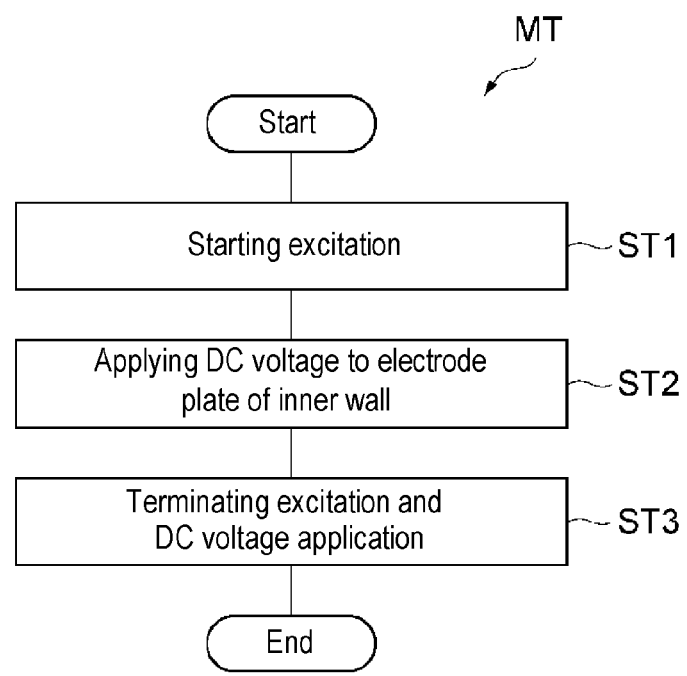

PLASMA PROCESSING APPARATUS

CROSS-REFERENCE TO RELATED APPLICATION

This application is based upon and claims the benefit of priority from Japanese Patent Application No. 2019-153599, filed on Aug. 26, 2019, the entire contents of which are incorporated herein by reference.

TECHNICAL FIELD

The present disclosure relates to a plasma processing apparatus.

BACKGROUND

Plasma may be used for etching a semiconductor wafer and the like. Patent Document 1 discloses a technique related to a plasma processing method for efficiently removing deposits containing metal. The plasma processing method removes deposits containing at least one of a transition metal and a base metal and adhering to a member disposed inside a processing container by plasma of a processing gas that contains a $C_xF_y$ gas and does not contain a chlorine-based gas and a nitrogen-based gas (where x is an integer of 2 or less and y is an integer of 6 or less).

PRIOR ART DOCUMENTS

Patent Documents

Patent Document 1: Japanese laid-open publication No. 2015-109412

SUMMARY

According to one embodiment of the present disclosure, there is provided an apparatus for plasma processing that performs an etching on a workpiece, including: a container; a gas supply system configured to supply a processing gas into the container; a plasma source configured to excite the processing gas supplied from the gas supply system; a support configured to hold the workpiece inside the container; an exhaust system configured to exhaust an internal space of the container; a plurality of electrode plates provided on an inner wall of the container; a plurality of insulators configured to electrically insulate the plurality of electrode plates from each other; a DC power supply configured to independently apply a DC voltage to each of the plurality of electrode plates; and a controller configured to control the gas supply system, the plasma source, and the DC power supply, wherein the controller controls the gas supply system, the plasma source, and the DC power supply such that the DC voltage is supplied to each of the plurality of electrode plates during execution of the etching or after completion of the etching.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart illustrating an example of a method according to one exemplary embodiment.

DETAILED DESCRIPTION

Figure 1:
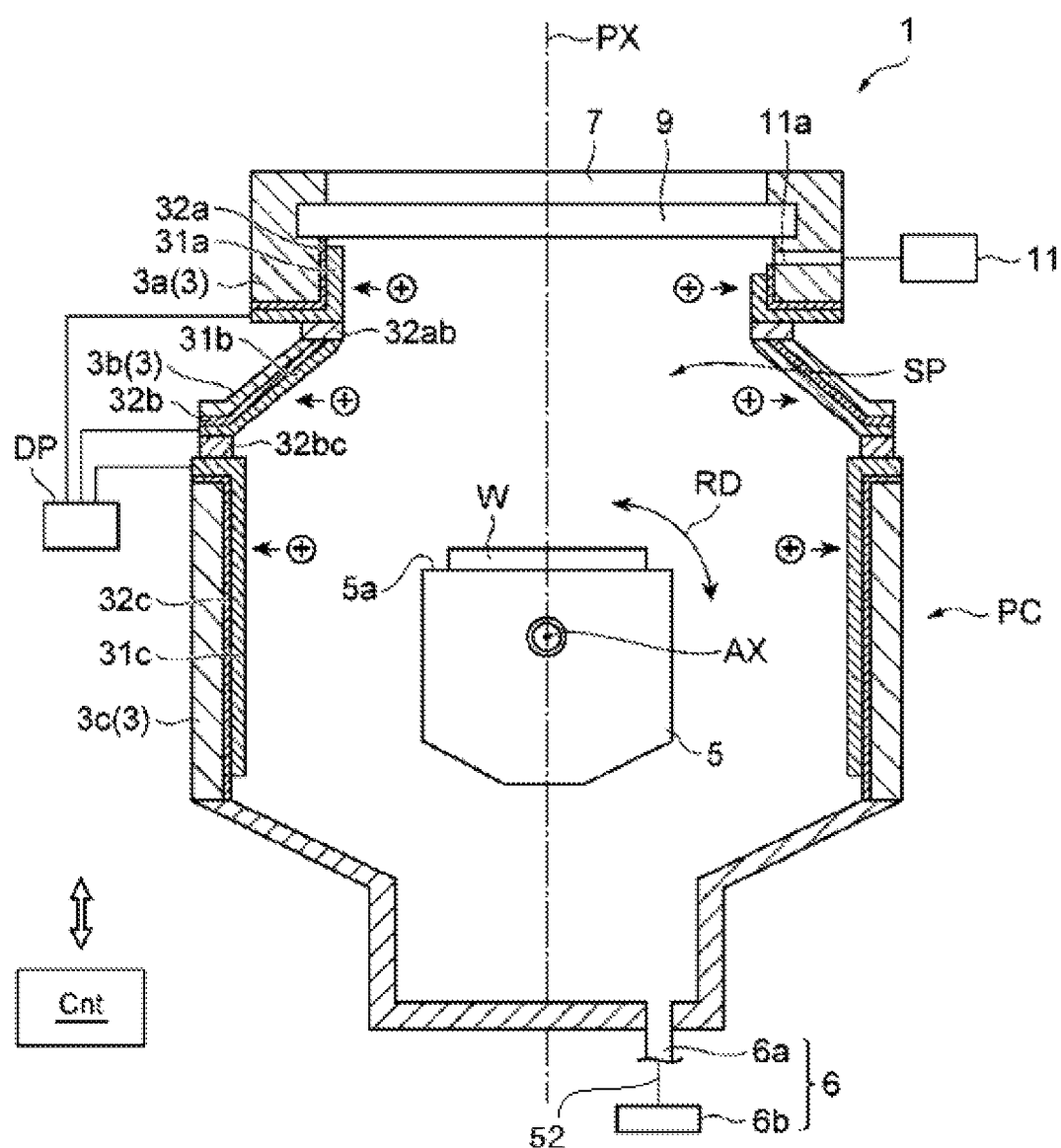
FIG. 1 is a view schematically illustrating an example of a schematic configuration of a plasma processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When etching a hard-to-etch material that has a relatively high vapor pressure and is hard to volatilize, deposits (re-deposition) may occur on an inner wall or the like of a processing container of a plasma processing apparatus. Such deposits may not be removed sufficiently even when the interior of the processing container is dry-cleaned. When the deposits are increased in film thickness, the deposits may peel off from the inner wall and adhere to a wafer. Accordingly, there is a demand for a technique for reducing the deposits occurring on the inner wall of the processing container due to etching. Various exemplary embodiments will be described below.

In one exemplary embodiment, there is provided a plasma processing apparatus. The plasma processing apparatus performs a plasma-based etching on a workpiece. The plasma processing apparatus includes a processing container, a gas supply system, a plasma source, a support, an exhaust system, a plurality of electrode plates, a plurality of insulators, a DC power supply, and a controller. The gas supply system supplies a processing gas into the processing container. The plasma source excites the processing gas supplied by the gas supply system. The support holds the workpiece inside the processing container. The exhaust system exhausts a space inside the processing container. The plurality of electrode plates are provided on the inner wall of the processing container. The plurality of insulators electrically insulate the plurality of electrode plates from each other. The DC power supply applies a DC voltage to each of the electrode plates independently. The controller controls the gas supply system, the plasma source, and the DC power supply. The controller controls the gas supply system, the plasma source, and the DC power supply such that the DC voltage is supplied to each of the plurality of electrode plates during execution of the plasma-based etching or after completion of the plasma-based etching. Accordingly, the deposits adhering to each of the plurality of electrode plates inside the processing container due to the plasma-based etching can be removed by sputtering using ions contained in plasma of the processing gas.

In one exemplary embodiment, the plurality of electrode plates may be arranged side by side from a lower portion of the inner wall to an upper portion thereof. Accordingly, the application of the DC voltage to the plurality of electrode plates can be independently controlled from the lower portion to the upper portion thereof.

In one exemplary embodiment, the plurality of electrode plates may be arranged side by side in a circumferential direction of the inner wall. Accordingly, the application of the DC voltage to the plurality of electrode plates can be independently controlled in the circumferential direction of the inner wall.

In one exemplary embodiment, the controller controls the DC power supply so as to apply the DC voltage with a height difference to each of the plurality of electrode plates. Accordingly, it is possible to flexibly apply the DC voltage to the plurality of electrode plates depending on the situations.

In one exemplary embodiment, the controller controls the DC power supply so as to apply the DC voltage with a height difference to each of the plurality of electrode plates according to the amount of deposits adhering to each of the plurality of electrode plates due to the plasma-based etching. Accordingly, the DC voltage applied to each of the plurality of electrode plates can be suitably adjusted according to the amount of deposits adhering to each of the plurality of electrode plates.

In one exemplary embodiment, the support supports the workpiece in a tiltable manner.

In one exemplary embodiment, a portion of the plurality of electrode plates is disposed to be tilted inward of the processing container toward the upper portion of the processing container.

In one exemplary embodiment, the processing gas includes an Ar gas.

In one exemplary embodiment, there is provided a method of maintaining the interior of a processing container of a plasma processing apparatus that performs a plasma-based etching on a workpiece. This method is performed during execution of the plasma-based etching or after completion of the plasma-based etching. The method includes supplying a processing gas into the processing container, and applying a DC voltage to each of a plurality of electrode plates installed on an inner wall of the processing container. The DC voltage is applied to each of the electrode plates in an independent manner. The plurality of electrode plates are electrically insulated from each other. Accordingly, deposits adhering to each of the plurality of electrode plates inside the processing container due to the plasma-based etching can be removed by sputtering using ions contained in plasma of the processing gas.

Hereinafter, various exemplary embodiments will be described in detail with reference to the drawings. Throughout the drawings, the same or corresponding parts will be denoted by the same reference numerals.

FIG. 1 schematically shows a schematic configuration of a plasma processing apparatus 1 according to one exemplary embodiment. The plasma processing apparatus 1 performs a plasma-based etching.

The plasma processing apparatus 1 includes an inner wall 3, a support 5, an exhaust system 6, a plasma source 7, a dielectric plate 9, a gas supply system 11, a gas discharge hole 11a, a processing container PC, a controller Cnt, and a DC power supply DP. The plasma processing apparatus 1 further includes a plurality of electrode plates and a plurality of insulators.

The plurality of electrode plates may include, for example, a first electrode plate 31a, a second electrode plate 31b, and a third electrode plate 31c. In the present disclosure, the first electrode plate 31a, the second electrode plate 31b, and the third electrode plate 31c may be collectively referred to as a plurality of electrode plates.

The plurality of insulators may include, for example, an insulator 32a, an insulator 32b, an insulator 32c, an insulator 32ab, and an insulator 32bc. In the present disclosure, the insulator 32a, the insulator 32b, the insulator 32c, the insulator 32ab, and the insulator 32bc may be collectively referred to as a plurality of insulators.

The processing container PC accommodates the support 5. The support 5 is installed inside the processing container PC and has a placement surface 5a. The support 5 holds a substrate W (workpiece) on the placement surface 5a inside the processing container PC. The support 5 supports the substrate W in a tiltable manner in a rotational direction RD about an axis AX.

The exhaust system 6 exhausts a processing space SP in the processing container PC. The exhaust system 6 includes an exhaust port 6a and an exhaust device 6b. The exhaust port 6a is formed below the support 5 (for example, on a bottom portion of the processing container PC). The exhaust device 6b is connected to the exhaust port 6a via an exhaust pipe 52. The exhaust device 6b may include a pressure regulating valve and a vacuum pump such as a turbo molecular pump.

The processing container PC has a substantially cylindrical shape. In one embodiment, a central axial line of the processing container PC coincides with an axis line PX. The processing container PC provides the processing space SP in which the plasma-based etching is performed on the substrate W.

In one embodiment, the lower portion of the processing container PC that accommodates the support 5 may have substantially a constant width. The middle portion of the processing container PC, which extends from the upper end of the lower portion of the processing container PC, has a tapered shape in which the width thereof becomes gradually narrower toward the upper portion of the processing container PC. The upper portion of the processing container PC may have substantially a constant width.

An opening is formed in the ceiling of the upper portion of the processing container PC. The opening is closed by the dielectric plate 9. The dielectric plate 9 has a plate-like body. The material of the dielectric plate 9 may be quartz glass or ceramics.

The plasma source 7 is provided in the upper portion (especially the ceiling portion) of the processing container PC. The plasma source 7 is installed on the dielectric plate 9. The plasma source 7 excites the processing gas supplied into the processing container PC by the gas supply system 11.

The plasma source 7 may include two high-frequency power supplies and two antenna elements. The two high-frequency power supplies of the plasma source 7 output high-frequency power for plasma generation. Each of the two antenna elements of the plasma source 7 forms a magnetic field for plasma generation in the processing space SP by the high-frequency power output from each of the two high-frequency power supplies of the plasma source 7.

The gas supply system 11 supplies the processing gas into the processing space SP of the processing container PC. The gas supply system 11 is connected to the gas discharge hole 11a. The gas discharge hole 11a penetrates into the processing space SP through the inner wall 3. The gas discharge hole 11a is formed at a position close to the plasma source 7. The processing gas output from the gas supply system 11 is supplied into the processing space SP via the gas discharge holes 11a.

The processing gas may include gas species used for the plasma-based etching. The processing gas used when performing a process shown in a flowchart of FIG. 2 described later may include, for example, an Ar gas.

The plurality of electrode plates (the first electrode plate 31a, the second electrode plate 31b, and the third electrode plate 31c) are installed on the inner wall 3 of the processing container PC. The inner wall 3 defines the processing space SP of the processing container PC. Hereinafter, in the present disclosure, the inner wall 3 will be described as a side wall as illustrated in FIG. 1, but the present disclosure is not limited thereto. For example, the inner wall 3 may include a bottom wall provided at the bottom portion of the processing container PC. In particular, a portion (the second electrode plate 31b) of the plurality of electrode plates is provided in the tapered middle portion of the processing container PC. In this case, the second electrode plate 31b is disposed along the surface of the inner wall 3 defining the tapered shape so as to be tilted inward of the processing container PC toward the upper portion of the processing container PC.

The material of each of the plurality of electrode plates has electrical conductivity and may be, for example, aluminum. The material of the inner wall 3 has electrical conductivity and may be, for example, aluminum. The inner wall 3 is electrically grounded.

The plurality of electrode plates may be arranged side by side from the lower portion to the upper portion of the inner wall 3 (in a first arrangement). In some embodiments, the plurality of electrode plates may be arranged side by side in a circumferential direction of the inner wall 3 (in a second arrangement). The arrangement of the plurality of electrode plates may be an arrangement including both the first arrangement and the second arrangement described above. In the case of the first arrangement, the application of the DC voltage to the plurality of electrode plates can be independently controlled between the lower portion and the upper portion of the inner wall 3. In the case of the second arrangement, the application of the DC voltage to the plurality of electrode plates can be independently controlled in the circumferential direction of the inner wall 3.

The plurality of insulators including the insulator 32a and the like have an insulating material and shape, and are arranged so as to electrically insulate the first electrode plate 31a, the second electrode plate 31b, and the third electrode plate 31c from each other.

The insulator 32a is installed between a surface of a first region 3a of the inner wall 3 and the first electrode plate 31a. The first electrode plate 31a is provided in the first region 3a of the inner wall 3 via the insulator 32a. The material of the insulator 32a has an electrically insulating property and may be, for example, an adhesive having an insulating property. The first region 3a of the inner wall 3 and the first electrode plate 31a are electrically insulated from each other by the insulator 32a.

The insulator 32b is provided between a surface of a second region 3b of the inner wall 3 and the second electrode plate 31b. The second electrode plate 31b is provided in the second region 3b of the inner wall 3 via the insulator 32b. The material of the insulator 32b has an electrically insulating property and may be, for example, an adhesive having an insulating property. The second region 3b of the inner wall 3 and the second electrode plate 31b are electrically insulated from each other by the insulator 32b.

The insulator 32c is provided between a surface of a third region 3c of the inner wall 3 and the third electrode plate 31c. The third electrode plate 31c is provided in the third region 3c of the inner wall 3 via the insulator 32c. The material of the insulator 32c has an electrically insulating property and may be, for example, an adhesive having an insulating property. The third region 3c of the inner wall 3 and the third electrode plate 31c are electrically insulated from each other by the insulator 32c.

The insulator 32ab is provided between the first electrode plate 31a and the second electrode plate 31b. The first electrode plate 31a and the second electrode plate 31b are electrically insulated from each other by the insulator 32ab. The insulator 32bc is provided between the second electrode plate 31b and the third electrode plate 31c. The second electrode plate 31b and the third electrode plate 31c are electrically insulated from each other by the insulator 32bc.

As described above, the first electrode plate 31a, the second electrode plate 31b, and the third electrode plate 31c are electrically insulated from each other by the plurality of insulators. Further, the first electrode plate 31a, the second electrode plate 31b, the third electrode plate 31c, and the electrically grounded inner wall 3 are electrically insulated from each other by the plurality of insulators. Accordingly, the DC voltage can be applied to the plurality of electrode plates including the first electrode plate 31a and the like independently of each other.

The DC power supply DP independently applies the DC voltage to each of the first electrode plate 31a, the second electrode plate 31b, and the third electrode plate 31c that are electrically insulated from each other.

The controller Cnt includes a computer having a CPU, a ROM, a RAM, and the like, and controls the gas supply system 11, the plasma source 7, and the DC power supply DP by executing a computer program. The controller Cnt executes, for example, the process shown in the flowchart of FIG. 2 by controlling the gas supply system 11, the plasma source 7, and the DC power supply DP. More specifically, the controller Cnt applies the DC voltage to each of the plurality of electrode plates during execution of the plasma-based etching or after completion of the plasma-based etching. The application of the DC voltage may be performed, for example, after starting the excitation of the processing gas containing Ar, but may be performed simultaneously with the excitation or before the excitation.

The controller Cnt controls the DC power supply DP such that the DC voltage with a height difference is supplied to each of the plurality of electrode plates. For example, based on data measured in advance, the controller Cnt controls the DC power supply DP such that the DC voltage with a height difference is supplied to each of the plurality of electrode plates according to the amount of deposits adhering to each of the plurality of electrode plates due to the plasma-based etching. Accordingly, it is possible to flexibly apply the DC voltage to the plurality of electrode plates depending on the situations. In particular, it is possible to suitably adjust the DC voltage applied to each of the plurality of electrode plates according to the amount of deposits on each of the plurality of electrode plates.

Next, a method of maintaining the interior of the processing container PC of the plasma processing apparatus 1 will be described. A method MT shown in the flowchart of FIG. 2 is a method of maintaining the interior of the processing container PC of the plasma processing apparatus 1 according to an exemplary embodiment. The method MT shown in FIG. 2 is executed by the controller Cnt which controls various parts of the plasma processing apparatus 1, such as the plasma source 7, the gas supply system 11, and the DC power supply DP.

The method MT has step ST1, step ST2, and step ST3. The method MT is performed during execution of the plasma-based etching or after completion of the plasma-based etching. In particular, in the case where the method MT is performed after completion of the plasma-based etching, for example when a dry cleaning process is performed on the processing container PC, the method MT can be performed in parallel with (i.e., at the same time with) the dry cleaning process.

In step ST1, the controller Cnt supplies a processing gas containing an Ar gas into the processing container PC and starts excitation of the processing gas. In step ST1, plasma of the Ar gas is generated in the processing space SP of the processing container PC.

In step ST2 after the start of excitation in step ST1, the controller Cnt applies a DC voltage to each of the plurality of electrode plates provided on the inner wall 3 of the processing container PC in an independent manner. The plurality of electrode plates are electrically insulated from each other as described above. In step ST2, in the plurality of electrode plates to which the DC voltage is applied, deposits generated due to the plasma-based etching can be removed by sputtering with positive ions contained in the plasma of Ar gas.

The DC voltage application performed in step ST2 may be performed, for example, after 5 seconds or more from the start of excitation (plasma ignition) in step ST1. Immediately after the plasma ignition, since the plasma stays in an unstable state, the application of the DC voltage may be started in step ST2 after the plasma is stabilized. The application of the DC voltage may be performed simultaneously with the excitation (plasma ignition) or before the excitation.

In one embodiment, a voltage value of the DC voltage applied to the plurality of electrode plates in step ST2 may fall within a range of −90 to 0[V]. With this voltage value, the sputtering with positive ions in plasma can be effectively performed on deposits adhering to the plurality of electrode plates.

Further, in step ST2, the application of the DC voltage may be simultaneously performed on all of the plurality of electrode plates. In this case, since the sputtering with the positive ions is simultaneously performed on all of the plurality of electrode plates, the deposits inside the processing container PC can be efficiently removed.

In step ST3 subsequent to step ST2, when a preset condition is satisfied (for example, the processing time of step ST2 elapses), the controller Cnt terminates the excitation of the processing gas containing the Ar gas and the application of the DC voltage to the plurality of electrode plates.

According to the configuration described above, the deposits adhering to each of the plurality of electrode plates inside the processing container PC due to the plasma-based etching can be removed by the sputtering with ions (for example, positive ions) contained in the plasma of the processing gas. Even when the deposits generated in the processing container PC due to the plasma-based etching include a hard-to-etch material that is hard to be removed by dry cleaning, the deposits can be sufficiently removed by the sputtering with the ions in the plasma.

According to the present disclosure in some embodiments, it is possible to provide a technique for reducing deposits adhering to an inner wall of a processing container due to etching.

Although various exemplary embodiments have been described above, the present disclosure is not limited to the above-described exemplary embodiments, but various omissions, substitutions, and changes may be made. Further, elements in different exemplary embodiments may be combined with each other to implement other exemplary embodiments.

From the foregoing description, it should be understood that various exemplary embodiments of the present disclosure have been described herein for purposes of illustration and various changes may be made without departing from the scope and spirit of the present disclosure. Therefore, the various exemplary embodiments disclosed herein are not intended to be limiting, and the true scope and spirit of which is indicated by the appended claims.

What is claimed is:

1. An apparatus for plasma processing that performs an etching on a workpiece, comprising:
    a container;
    a gas supply system configured to supply a processing gas into the container;
    a plasma source configured to excite the processing gas supplied from the gas supply system;
    a support configured to hold the workpiece inside the container;
    an exhaust system configured to exhaust an internal space of the container;
    a plurality of electrode plates provided on an inner wall of the container;
    a plurality of insulators configured to electrically insulate the plurality of electrode plates from each other;
    a DC power supply configured to independently apply a DC voltage to each of the plurality of electrode plates; and
    a controller configured to control the gas supply system, the plasma source, and the DC power supply,
    wherein the controller controls the gas supply system, the plasma source, and the DC power supply such that the DC voltage is supplied to each of the plurality of electrode plates during execution of the etching or after completion of the etching.

2. The apparatus of claim 1, wherein the plurality of electrode plates are arranged side by side from a lower portion of the inner wall toward an upper portion of the inner wall.

3. The apparatus of claim 2, wherein the plurality of electrode plates are arranged side by side in a circumferential direction of the inner wall.

4. The apparatus of claim 3, wherein the controller controls the DC power supply such that the DC voltage with a height difference is supplied to each of the plurality of electrode plates.

5. The apparatus of claim 4, wherein the controller controls the DC power supply such that the DC voltage with the height difference is supplied to each of the plurality of electrode plates according to an amount of deposits adhering to each of the plurality of electrode plates due to the etching.

6. The apparatus of claim 5, wherein the support supports the workpiece in a tiltable manner.

7. The apparatus of claim 6, wherein a portion of the plurality of electrode plates is disposed to be tilted inward of the container toward the upper portion of the container.

8. The apparatus of claim 7, wherein the processing gas includes an Ar gas.

9. The apparatus of claim 1, wherein the plurality of electrode plates are arranged side by side in a circumferential direction of the inner wall.

10. The apparatus of claim 1, wherein the controller controls the DC power supply such that the DC voltage with a height difference is supplied to each of the plurality of electrode plates.

11. The apparatus of claim 1, wherein the support supports the workpiece in a tiltable manner.

12. The apparatus of claim 1, wherein a portion of the plurality of electrode plates is disposed to be tilted inward of the container toward an upper portion of the container.

13. The apparatus of claim 1, wherein the processing gas includes an Ar gas.

* * * * *